United States Patent
Nygaard, Jr. et al.

(10) Patent No.: US 6,810,346 B2
(45) Date of Patent: Oct. 26, 2004

(54) COMPOSITE EYE DIAGRAMS

(75) Inventors: Richard A Nygaard, Jr., Colorado Springs, CO (US); Jeffrey John Haeffele, Monument, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 129 days.

(21) Appl. No.: 10/061,918

(22) Filed: Jan. 31, 2002

(65) Prior Publication Data

US 2003/0158687 A1 Aug. 21, 2003

(51) Int. Cl.$^7$ .......................... G01R 27/28; G01R 31/00
(52) U.S. Cl. ....................... 702/117; 702/66; 324/76.12
(58) Field of Search ........................ 702/57, 58, 64–72, 702/79, 108, 117, 123–125, 189, 194; 324/76.12, 76.15, 76.19, 76.22, 76.24; 375/226, 227, 371; 345/440

(56) References Cited

U.S. PATENT DOCUMENTS

| | | | | |
|---|---|---|---|---|
| 4,381,546 A | * | 4/1983 | Armstrong | 375/227 |
| 5,343,405 A | * | 8/1994 | Kucera et al. | 702/73 |
| 5,959,607 A | | 9/1999 | Montijo | |
| 6,151,010 A | | 11/2000 | Miller et al. | |
| 6,366,374 B2 | * | 4/2002 | Bradshaw et al. | 398/17 |
| 6,385,252 B1 | * | 5/2002 | Gradl et al. | 375/257 |

FOREIGN PATENT DOCUMENTS

| | | | |
|---|---|---|---|
| EP | 1241483 A1 | 3/2001 | |
| EP | 1143654 A2 | * 10/2001 | H04L/1/20 |

OTHER PUBLICATIONS

Madhavan B. et al. "A 55.0 GB/s/cm Data Bandwidth Density Interface in .05 micrometer CMOS for Advanced Parallel Optical Interconnects", 1998 Electronic Letters. vol. 34. pp. 1846–1847.*

Christopher M. Miller, High–Speed Digital Transmitter Characterization Using Eye Diagram Analysis, 1266 Hewlett–Packard Journal 45(1944) Aug., No,4, pp. 29–37.

www.synthesysresearch.com, BitAlyzer 1500 Bit Error Rate Analyzer, printed from internet Mar. 8, 2004, SyntheSys Research, Inc.

* cited by examiner

Primary Examiner—Marc S. Huff
Assistant Examiner—Manuel L Barbee
(74) Attorney, Agent, or Firm—Edward L. Miller

(57) ABSTRACT

An eye diagram analyzer assigns a plurality of SUT data signals to be members of a labeled group of channels. There may be a plurality of such groups. In addition to mere superposition in an (X, Y) display space of the various i-many (X, Y)-valued pixels for individual component eye diagrams associated with that group, other measured data for those pixels within a group can be merged in various different modes to produce corresponding composite eye diagram presentations. E.g., in a Normalized Signal Density Mode the number of hits at each trial measurement point is summed over all channels in the group, and then divided by the total number of clock cycles measured for the $i_{th}$ measurement point in that group to produce a density $D_i$ associated with the corresponding $i_{th}$ pixel: $(X_i, Y_i, D_i)$. If $D_i$ is rendered as a color or an intensity, the resulting eye diagram includes a representation (the $D_i$) of a normalized density of transitions at each point $(X_i, Y_i)$, relative to that group as a whole. As a further example, in a Channel Density Mode, each $D_i$ is produced by accumulating, for each of N-many channels, a 1/N for each sample (value of i) with non-zero signal activity, and dividing the accumulation by N. If that collection of $D_i$ is rendered as a color or an intensity, the resulting composite eye diagram includes a representation (the $D_i$) at each $(X_i, Y_i)$ point of the degree of coincidence among, or a degree of similarity between, the channels in the group.

12 Claims, 2 Drawing Sheets

A COMPOSITE EYE DIAGRAM FOR GROUP 1

ASSIGNING CHANNELS TO GROUPS 1-3

A COMPOSITE EYE DIAGRAM FOR GROUP 1

COMPOSITE EYE DIAGRAMS

REFERENCE TO RELATED APPLICATION

The subject matter of the present Application pertains to the measurement of eye diagrams in general, and is especially well suited for one eye diagram measurement technique in particular, which technique is also usable in a logic analyzer adapted to perform eye diagram measurements, or in a stand-alone circuit within an item of separate test equipment intended for that purpose. And although we disclose herein the nature and the general principles of that technique in sufficient detail to allow a complete understanding of the invention, a tangible implementation of that technique has complexity beyond what is easily summarized and is capable of performing additional functions. A preferred implementation of that technique is the subject matter of a US patent application entitled METHOD AND APPARATUS FOR PERFORMING EYE DIAGRAM MEASUREMENTS bearing Ser. No. 10/020,673 which was filed on Oct. 29, 2001 by Richard A. Nygaard, Jr. and assigned to Agilent Technologies, Inc. Because the subject matter of that Application is thus of interest to that of the present invention, and for the sake of brevity, "METHOD AND APPARATUS FOR PERFORMING EYE DIAGRAM MEASUREMENTS" is hereby expressly incorporated herein by reference.

BACKGROUND OF THE INVENTION

Eye diagrams are a conventional format for representing parametric information about signals, and especially digital signals. We shall refer to an item of test equipment or a measurement circuit arrangement that creates an eye diagram as an eye diagram tester, whether it is found in an oscilloscope, a BERT (Bit Error Rate Tester), a logic analyzer, or, as a separate item of test equipment. 'Scopes and BERTs each have their own inherent (and different) types of circuit architecture that they use to create eye diagrams, and thus belong to the class of Eye Diagram Testers. The preferred method (and by implication, any corresponding circuit apparatus) to be disclosed herein is that of the incorporated Application, is different than those used in 'scopes and BERTs, and is especially suitable for use within a logic analyzer, as well as an item of stand-alone test equipment. We shall call this different method (and any corresponding circuit apparatus) an Eye Diagram Analyzer, or EDA for short. By the definitions above, an EDA is a particular type of eye diagram tester.

A modern eye diagram for a digital signal is not so much a trace formed continuously in the time domain, as it is an "eye" shape composed of closely spaced points (displayed dots, or illuminated pixels) representing many (probably at least thousands, easily millions, and perhaps orders of magnitude more) individual measurement samples taken upon separate instances of a signal occurring on a channel of interest. Each measurement sample contributes to a displayed dot. To borrow an idea from the world of analog oscilloscopes, it is as though an infinite persistence continuous time domain trace (for the signal of interest) were cut apart into lengths corresponding to one, five or ten clock times, and then stacked on top of each other. In the sampled digital case however, portions of the eye shape only appear continuous because the collection of dots is rather dense, owing to the large number of times that the signal is sampled. Unlike a true continuous technique, however, there may be detached dots that are separated from the main body of the eye shape. In any event, the vertical axis is voltage, and the horizontal axis represents the differences in time (i.e., various offsets) between some reference event and the locations for the measurement samples. The reference event is generally an edge of a clock signal in the system under test, represents directly or through some fixed delay the expected point in time when the value of an applied data signal would be captured by some receiving circuit in an SUT (System Under Test), and is derived from an application of the SUT's clock to the Eye Diagram Analyzer. The time axis will generally have enough length to depict one complete eye-shape (cycle of a DUT signal) centered about the reference, with sometimes perhaps several additional eyes (cycles) before and after. In general, the number of cycles shown depends upon how the measurement is set up, and could be more than several.

While not forgetting that oscilloscopes and Bit Error Rate Testers each have their own measurement paradigms, it will be useful for us briefly consider how the particular technique of interest to us operates. Different (X, Y) regions of an eye diagram represent different combinations of time and voltage. Assume that the eye diagram is composed of a number of pixels, and temporarily assume that the resolution is such that each different (X, Y) pixel position can represent a different combination of time and voltage (and vice versa), which combinations of time and voltage we shall term "measurement points." What the analyzer measures is the number of times, out a counted number of clock cycles, that the signal on the channel being monitored passed through a selected measurement point. Then another measurement point is selected, and the process repeated until there are enough measurement points for all the pixels needed for the display. The range over which the measurement points are varied is called a "sample space" and is defined during a measurement set-up operation. And in reality, we define the sample space and the resolution for neighboring measurement points first, start the measurement and then figure out later how to ascribe values to the pixels of the display. The "display" is, of course, an arbitrary graphic output device such as a printer or an X Window of some as yet unknown size in a window manager (e.g., X11) for a computer operating system. (The one-to-one correspondence between display pixels and measurement points we assumed at the start of this paragraph was just a convenient simplification for ease of explanation. It will be appreciated that it is conventional for display systems, such as X Windows, to ". . . figure out . . . how to ascribe values to the pixels . . . " when the correspondence is not one-to-one.)

The substance of an eye diagram, then is that it represents various combinations of circumstances that occurred in the data signal being characterized by the Eye Diagram Analyzer. However, the eye diagram trace itself is not a single time domain waveform (think: 'single valued function'), but is instead an accumulation of many such instances; it can present multiple voltage (Y axis) values for a given time value (X axis). So, for example, the upper left-hand region of an eye might represent the combination of an adequate logical one at an adequately early time relative to the SUT's clock signal, and an eye diagram whose trace passes robustly through that region indicates to us that a signal of interest is generally achieving a proper onset of voltage at a proper time. Furthermore, we note that there are also other regions, say, near the center of an eye, that are not ordinarily transited by the trace, and which if that were indeed to happen, would presumably be an indication of trouble. Thickening of the traces is indicative of jitter, a rounding of a corner is indicative of slow transitions, and so on. An eye diagram by itself cannot reveal in the time domain which isolated instance of the signal caused such an exception, as other types of measurements might, but it does provide timely and valid information about signal integrity within a system as it operates. In particular, by incorporating very long (perhaps "infinite") persistence the eye diagram presents readily seen evidence of occasional or infrequently occurring failures.

An eye diagram, then, is information about signal behavior at various time-voltage (X, Y) combinations. A simple system would be to indicate that the signal was "there" or that it wasn't. That is, respectively put either an illuminated pixel or a non-illuminated pixel at the various (X, Y) locations for the different instances of "there." This is about what an analog oscilloscope would do if it were used to create an eye diagram for some signal. However, we would notice that some parts of the trace were brighter than others, and understand that this is a (somewhat useful) artifact caused by finite persistence on the one hand (old stuff goes away) and relative rates of occurrence on the other. That is, the display ends up having an intensity component at each pixel location. This is fine as far as it goes, but we would rather not rely upon the persistence of phosphor for this effect, since the most interesting indications are apt to be also the faintest. Since we are not using an analog 'scope, anyway, and have an instrument (an EDA) with memory (akin to a digital oscilloscope, timing analyzer or logic analyzer), we can gather data and decide after the fact what pixel value is to go with each (X, Y) pixel location. Those pixel values can be variations in color, intensity, or both, according to whatever scheme is in use (and there are several). The general idea is that the operator configures the EDA to render the display in a way that makes the condition he is most interested is quite visible, and also such that the eye diagram as a whole is generally easy to interpret. Thus, the reader is reminded that there is usually more going on than simply the presence or absence of dots at some series of (X, Y) locations, and that we often have recourse to the notion of a "pixel value" at some (X, Y) position in the display. We shall denote with the symbol "V" whatever that "pixel value" is. V might be a single item, such as "ON" or "OFF" or it might be an intensity without the notion of color. On the other hand, V will often expand into a whole series of parameters $V_R$, $V_G$, $V_B$, ..., where each such parameter represents the intensity of an associated color. In any event, we shall simply write $(X, Y, V)_I$ or perhaps $(X_i, Y_i, V_i)$, depending upon which notation seems to work best for our needs at the time, and not bother to indicate any associated further expansion of a $V_i$ into its component parameters $V_R$, $V_G$, $V_B$.

It is often the case that the utility of an eye diagram is needed for characterizing or discovering circumstances that are both erroneous and very occasional. It is also the case that some SUTs have a great many channels that are subject to investigation. Some busses have hundreds of member signals, for example. When faced with such circumstances, the "luxury" of having one individual eye diagram trace per SUT signal becomes an oppressive burden. We might measure it that way, and we can indeed display it that way (with four or maybe eight channels at a time), but we likely will have lost all patience and become disgusted with the whole process before we complete looking at twenty-five or more sets of four or more traces each. Surely that is the wrong way to go about analyzing the data! But on the other hand, automating the investigation is risky. Masking measurements, for example, essentially require that we formally decide ahead of time what is not of interest. The analyzer can apply the mask for us automatically and at great speed, but we will never know for sure that there was not some irregularity in there that met the mask criteria, and yet that would have been of interest to us anyway, if we had only seen it.

Accordingly, another tool is needed to assist in eye diagram analysis for situations involving a large number of channels. What to do?

SUMMARY OF THE INVENTION

The needed tool is to merge into one combined eye diagram presentation the data of separate "component" eye diagram measurements for a useful grouping of related signals. Perhaps this is as simple as taking all the signals together as one single group and producing a single combined eye diagram from the merged data. Say, for example, each separate signal would produce an eye diagram of the same general shape as the other. Then we might simply combine them as if they were being stacked on top of one another, so to speak. That is, create a resulting eye diagram that is the superposition of the component eye diagrams. (The user of a 'scope might approximate such an outcome by adjustment of vertical position controls to superimpose separate traces.) Alternatively, the signals of interest might, for timing or other signal format reasons, be construed as being of some family in one group and of a different family in another group, and then individually considering the resulting two such separate combined eye diagrams, each of which corresponds to one of the groups. In any event, the operator can instruct the EDA to merge the data of individual eye diagrams for a specified plurality (family) of signals into one combined eye diagram. (However, we are going to combine arithmetic values for the sampled component data, and not mess with any notion of adjusting vertical position!) So now we have a combined eye diagram that probably has fat traces (indicating that, as expected, not all signals have simultaneous and identical rise times, voltage levels, etc.). Independent of that, we now expect that, having merged everything together, if there is something unusual going on, even if only occasionally for just one channel, we will, in principle, be able to see it. (Assuming, of course, that we do not implement some notion of short persistence.) Another assumption in this description is that the collection of data points comprising each of the component eye diagrams has the same general meaning, or type of rule for interpretation, as do the collections of data points in each of the other component eye diagrams.

We shall term such a combined eye diagram, created from the merging of data for individual component eye diagrams, a "composite" eye diagram.

In particular, then, an eye diagram analyzer can assign a plurality of SUT data signals to be members of a labeled group of channels for an eye diagram analyzer. There may be a plurality of such groups. In addition to a superposition in an (X, Y) display space of the various i-many (X, Y, V)-valued pixels for individual component eye diagrams associated with that group, other measured data for those pixels within a group can be merged in either of two different modes to produce corresponding composite eye diagram presentations. A central issue is to decide how to combine $V_i$ from one component eye diagram with the corresponding $V_i$ of another component eye diagram. They are combined to produce a "density" D of some sort. In a Normalized Signal Density Mode the number of hits at each measurement point is summed over all channels in the group, and then divided by the total number of clock cycles measured for the $i_{th}$ measurement point in that group to produce a measure Normalized Signal Density ($NSD_i$) associated with the corresponding $i_{th}$ pixel: $(X_i, Y_i, NSD_i)$. The notation $(X_i, Y_i, NSD_i)$ is perhaps awkward, and we can instead use simply $(X, Y, D)_i$ so long as we remember that D is Normalized Signal Density. If $D_i$ is rendered as a color or an intensity, the resulting eye diagram includes a representation (the $D_i$) of an adjusted, or normalized, density of transitions at each point $(X_i, Y_i)$, relative to that group as a whole. In an Average Signal Density Mode the number of hits at each measurement point for a signal is divided by the total number of clock cycles measured for the $i_{th}$ measurement point on that signal in the group, and those fractions are summed and then divided by the number of channels in the group, to produce a measure D=Average Signal Density ($ASD_i$) associated with the corresponding $i_{th}$ pixel: $(X_i, Y_i, D_i)$, where $D_i=ASD_i$. If $D_i$ is rendered as a color or an intensity, the resulting eye diagram includes a representation (the $D_i$) of the average density of transitions at each point $(X_i, Y_i)$, relative to that group as a whole. In a Channel Density (CD) Mode, for each trial measurement point the number of channels with non-zero signal activity is divided by the number of channels being considered, to produce a measure $D_i=CD_i$ associated with the corresponding $i_{th}$ pixel: $(X_i, Y_i, D_i)$. If $D_i$ is rendered as a color or an intensity, the resulting eye diagram includes a representation (the $D_i$) at each $(X_i, Y_i)$ point of the degree of coincidence among, or a degree of similarity between, the channels in the group.

DESCRIPTION OF A PREFERRED EMBODIMENT

Figure 1:
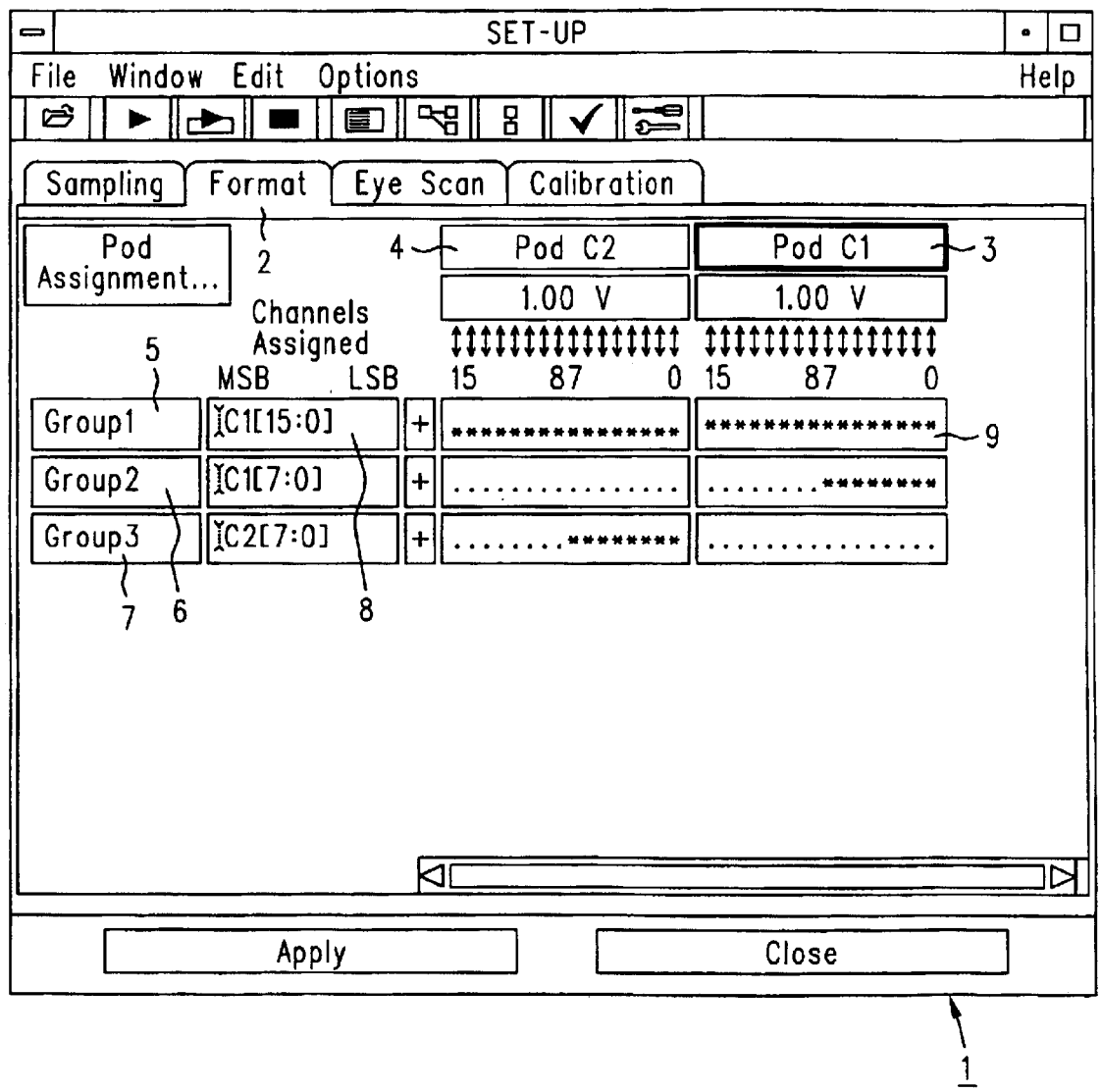
FIG. 1 is a screen image for an eye diagram analyzer display showing the assignment of signal channels to a group.

Let us begin by considering how one might cope with a collection of component eye diagrams for the signals in a System Under Test, and where there are more than just a few component eye diagrams. If there were just a few, then we could, of course, simply display each eye diagram, say, one above the other. But after, say, about six to eight eye diagrams that solution becomes awkward and increasingly impractical as the number of eye diagrams increases. If included in the same screen presentation, they become too small. If they are separately displayed as parts of different screen presentations, we are apt to miss significant differences, and it takes a long time to make a careful comparison. So the issue set out at the start of this paragraph remains a real concern, and it does not take much to persuade us that a sort of merging or overlay operation is a useful first step in reducing the complexity of making sense out of the eye diagrams for fifty, one hundred, or even more than two hundred channels. But can you "add" an original component eye diagram to another component eye diagram, so to speak, and still have an eye diagram? In short, the answer is "Yes," although the units involved in interpreting the resulting composite eye diagram may be different than those of the initial component eye diagrams we started with.

One first issue we face is that two component eye diagrams to be merged or combined might not really be commensurable, even if they are otherwise of the same type of measurement. For example, the incorporated Application discloses using proper fractions as some associated value $Z_i$ of an $i_{th}$ measurement point $(X_i, Y_i)$ within the sample space of an eye diagram (and therein called a 'measurement region' as opposed to the present 'measurement point'). The numerator of the fraction is the number of hits (instances where the signal passed through or sufficiently near the measurement point), while the denominator is the number of clock cycles for which the measurement took place. Typically, some visible cue concerning frequency of occurrence is imparted to the displayed pixels $(X_i, Y_i, V_i)$ forming the corresponding eye diagram, either using intensity or color, or some combination of each. (That is, the values of the various proper fractions $Z_i$ become the basis for the aforementioned values $V_i$ of the displayed pixels.) Since each measurement point has a corresponding proper fraction (i.e., a value between zero and one) it is easy to make that into, say, an intensity range of completely dark to fully on. But, if a measurement point for one signal was taken over several millions of clock cycles, and the corresponding measurement point for another signal was taken over just a few hundred, then it is clear that how we choose to combine the fractions has a lot to do with what the result means.

One way to combine two Z values p/m and q/n for two measurement points is to say that it ought to be (p+q)/(m+n). This is still a proper fraction, and it weights the manner of combination in favor of the measurement with the most history (larger denominator), and weights the contributions evenly if m and n are equal. This manner of eye diagram "addition" can be extended to any number of contributing component eye diagrams, and is called the Normalized Signal Density Mode of merging eye diagrams.

$$NSD_i=\Sigma\text{\# of hits for channel } J@(X, Y)_i/\Sigma\text{\# of clocks for channel } J@(X, Y)_i \quad (1)$$

where each $\Sigma$ is from $J=1$ to $J=N$ and $N=$# of channels

Another way to combine two Z values p/m and q/n for two measurement points, which we have called the Average Signal Density Mode of merging eye diagrams, is as follows.

$$ASD_i=(1/N)\Sigma[\text{\# of hits for channel } J@(X, Y)_i/\text{\# of clocks for channel } J@(X, Y)_i] \quad (2)$$

where the $\Sigma$ is from $J=1$ to $J=N$ and $N=$# of channels

There is yet another way to combine the Z values p/m and q/n for two corresponding measurement points. If p is nonzero, replace the value p/m with the value 1. Otherwise, replace p/m with the value 0. Similarly, if q is nonzero, replace the value q/n with the value 1, or 0 otherwise. We thus have a rule (notational device) for substituting with a parameter $\Delta$: $\Delta(i, J)=[1|0]$, where i is the pixel location $(X, Y)_i$ and J is the channel.

$$CD_i=\Sigma\Delta(i, J)/N \quad (3)$$

where the $\Sigma$ is from $J=1$ to $J=N$ and $N=$# of channels

This manner of eye diagram addition is called the Channel Density Mode, and is more of a logic-type of combination, in that equal weight is given to events that happened at all, and the weighting is not based on their relative rates of occurrence. Once again, the rendering mechanism will handle this mode of composite eye diagram without difficulty if we simply arrange that the data structure has previously added fractions produced in accordance with the Channel Density Mode of merging original component eye diagrams.

There is also a variant of any of the above-described Density Modes that deserves mention. Suppose that the output display mechanism supports neither color nor variable intensity: say, it either prints a dot or it doesn't. Or, suppose we wish to pretend that such is the case, even if it is not. Now we add all the corresponding fractions, and treat any non-zero sum as one, while leaving sums that are zero unaltered. The result is a close approximation of an infinite persistence oscillographic display where each of the component traces has been repositioned to superimpose them upon one another. We call that the Solid Color Mode.

Each of the above described types of eye diagram "addition" produces a composite eye diagram as a resulting quantity. If none of the original component eye diagrams had a "hit" in a particular place [corresponding to a measurement value of $Z_t=0$ for that $(X, Y)_t$ and which, if we chose, would correspond to a non-illuminated pixel], then neither does the composite sum reflect a hit. For pixels in the same position that are illuminated, there will still be something there, in that same position, although it may be weighted somewhat differently. The real difference arises in how the different modes of addition treat pixels that would be illuminated in some position for one component eye diagram but would not be illuminated in the corresponding position in another component eye diagram. The Normalized Signal Density mode "puts it into perspective," so to speak, while the Channel Density Mode exaggerates that situation to make it easier to spot. The Solid Color Mode variant really accentuates differences by suppressing intensity difference or color difference information, in favor of purely position indications, as if by a mere super imposing of traces upon one another.

It will be noted, however, that in each of the described methods the data for the component eye diagrams are first arithmetically combined into one composite set of data, which is then rendered as a single unit to produce the composite eye diagram. This is definitely not the same as separately rendering each component into what has been arranged to be the same place on the screen (say, by adjustment of vertical position controls).

A powerful aspect about our approach in this matter is that the rendering mechanism in the eye diagram analyzer of the incorporated Application displays eye diagrams with a specified resolution in a specified array of pixels, given a collection of proper fractions in a data structure. To get that eye diagram analyzer to render a composite eye diagram using a density of a selected type, all we have to do is give it an instance of that same type of data structure, but that contains the appropriate new fractional summations. Accordingly, we can operate on existing component eye diagrams (post data collection processing) to produce various different composite eye diagrams expressed in the same style data structure, and then display that result. If subsequent consideration suggests another composite would be useful, then we can produce it by post processing, too, all without the need to recapture the data. And it should be noted that we might never bother to display the individual component eye diagrams, although we could if we wanted to, and we just might, depending upon what seems to be going on in the System Under Test.

Figure 2:
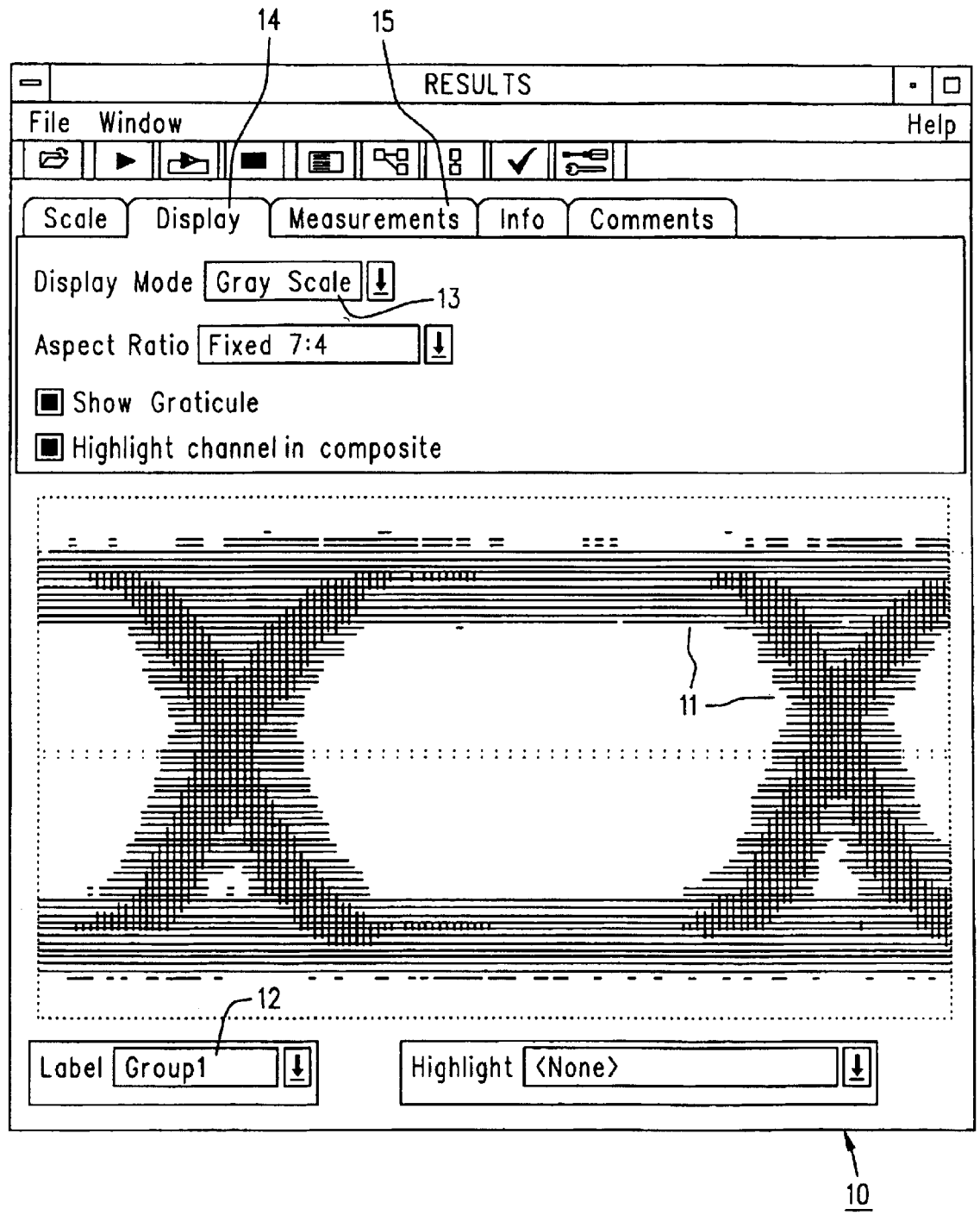
FIG. 2 is a screen image for an eye diagram analyzer display showing an example composite eye diagram produced from component eye diagrams (not shown) measured by an eye diagram analyzer constructed in accordance with the invention.

We turn now to the FIGS. 1 and 2 for illustration of the material that has been under discussion. The overall system of which these are a part is (preferably) a Linux operating system that executes on an computer system embedded within the EDA and that manages a captive application that is an Eye Diagram Analyzer control program. The captive application program functions as a user interface ("control panel" for input), control unit for some data sampling hardware and memory for sample data storage, processing of stored data ("analysis"), and display of processed results ("control panel" for output). FIG. 1 is associated with a user interface for the operator's control inputs, and is a simplified line drawing representation of a menu of choices in a SET-UP window that appears on a screen having a screen pointer and an associated mouse and keyboard (neither of which are shown). FIG. 2 is a line drawing representation of a menu of choices in a RESULTS window, is also mouse driven, and pertains to the display of composite eye diagrams, where the rule for combining component eye diagrams has been selected or specified in yet some other window (not shown). There is also a window or menu at a higher level of abstraction (and which we have not shown, either) that indicates the SET-UP and RESULTS windows of FIGS. 1 and 2 as choices (i.e., that's how the SET-UP and RESULTS windows are entered).

Turning now to FIG. 1, then, note that it illustrates a SET-UP window 1 including a Format tab 2 that has been selected to be the "front" tab (in accordance with well known Graphical User Interface [GUI] techniques). The Format tab 2 allows the definition of groups. This consists of specifying group names (5, 6 and 7, and which in this example are Group 1, Group 2 and Group 3, respectively), and the association of channels with those named groups. Note that a legend "Pod C1" appears in a box 3, beneath which are certain indicia, including a row of asterisks in box 9. There are various locations to mount probe pods, and these are designated A, B, C, and so on. At each location there can be several such pods: pod #1, pod #2, etc. So, "Pod C1" of box 3 means the #1 probe pod installed in the C location. The row of asterisks in box 9 corresponds to a natural ordering of the DUT input signals associated with that probe pod, and indicates which ones have been assigned. The legend in box 8 indicates the channel assignment names that are associated with the row of asterisks. The net result of the Figure is that Group 1 is sixteen bits from Pod C1 and that the names of the associated channels are C1[15], C1[14], . . . C1[0]. There is quite a bit of flexibility afforded here, and we see that the least significant eight of DUT input signals for Group 1 are also assigned to Group 2 as C1[7:0]. Note also that Group 3 is C2[7:0]. There is a small data structure inside the EDA that records all such assignments of channels to groups. We shall be interested in Group 1, and now that we have seen how it was defined, we turn to FIG. 2 to see how it is used.

FIG. 2 illustrates a RESULTS window 10 within which is displayed a composite eye diagram 11 for Group 1. It is for Group 1 because that is the choice that has been selected in box 12. The eye diagram 11 is of a particular type of composite (Normalized Signal Density, Average Signal Density, Channel Density) selected in accordance with a menu of such choices found in some convenient location, say, as part of the Measurements tab 15. Alternatively, that menu (which is a conventional drop down or other standard GUI type menu) could be a part of the Display tab 14, which in the figure is currently the tab in front. Also part of the Display tab 14 is a drop down menu for Display Mode whose current selection is designated by the legend "Gray Scale" in box 13. There are several choices that could have been selected here, many of which involve intensity and color combinations that are impossible to conveniently represent in a standard patent drawing. The reader will easily appreciate that what is desired here is essentially some way to make one part of the displayed eye diagram 11 distinguishable from another part, so that if the condition of interest does not show up as an odd shape (wrong voltage, misplaced transition, etc.) that alters the outline, it will be missed unless there is a way to change the displayed interior of the eye diagram. This is, in itself, conventional, so we picked a gray scale option that is not color oriented, and then use horizontal hatching to indicate a region of "darker gray" and horizontal and vertical hatching to denote a "brighter gray" region. This is a pretty simple example, and most users with a complex problem would likely opt for a displayed data format that is supportive of more extensive interpretation. In and of itself, that is conventional also, but not in conjunction with composite eye diagrams.

We conclude with some remarks pertaining to the data structures in which eye diagrams are stored, and how those are used in conjunction with the creation of composite eye diagrams from component eye diagrams. The following material contains additional detail, and may be thought of as an Appendix, as it may contain legends and names for various constructs that are not expressly introduced ahead of time by the (more simplified) earlier part of the Specification.

ChannelScan Data Structure for One Channel

This structure saves the raw measurement data from scanning. Information for display is derived from this structure by interpolation.

```
struct
{
    u32 channel;        // input channel number
    i32 tRes;           // time between each point, fs
    i32 vRes;           // voltage between each row, uV
    i32 tMin;           // time at left point (point = 0), fs
    i32 vMin;           // voltage at bottom row (row = 0), uV
    i32 jCols;          // number of columns (number of time points in
                        //   each row)
    i32 kRows;          // number of rows (number of voltage levels)
    u32 *pNumCounts;    // allocated 2-D array of count data [row][col]
    u32 *pNumClocks;    // allocated 2-D array of clock data [row][col]
} ChannelScan;
```

TABLE I

Description of data types

| | |
|---|---|
| u32 | unsigned 32 bit integer (0 . . . 4 294 967 295) |
| i32 | signed 32 bit integer (−2 147 483 648 . . . 2 147 483 647) |
| "allocated" | memory assigned from a common memory pool by calling an allocation function |

The structure holds two 2-D arrays. The two arrays are the same size. Each is kRows by jCols. Array indices start at zero, following the C language convention:

TABLE II

Array layout for count and clock values

| | col 0 | col 1 | Col 2 | . . . | col (jCols−1) |
|---|---|---|---|---|---|
| row 0 | | | | | |
| row 1 | | | | | |
| row 2 | | | | | |
| . . . | | | | | |
| Row (kRows−1) | | | | | |

The array cell at [row, col]=[0, 0] holds information acquired at (T, V)=(tMin, vMin). The cell [I,j] holds information acquired at (tMin+(j*tRes), vMin+(I*vRes)).

Each cell in pNumClocks gives the number of clock cycles observed at that combination of(T, V) when the measurement was taken. A value of zero means no measurement was taken. If all cells in pNumClocks are zero, then no measurement has been made on this channel.

Each cell in pNumCounts gives the number of clock cycles where signal activity was observed at that combination of (T, V) when the measurement was taken. This value is less than or equal to the value in the corresponding cell in pNumClocks.

CompositeScan Data Structure for a Composite of Two or More Channels

A CompositeScan structure holds the result of combining ChannelScan measurements from one or more unique channels. One useful utility structure is a bit set. BitSet holds the identity of the channel(s) making up the composite and the identity of the channel(s) contributing signal activity at each point in the composite.

```
struct
{
    u32 nBits;      // Number of one-bit flags stored in pBits
    u32 *pBits;     // allocated array holding the one-bit flags
} BitSet;
```

A BitSet structure holds a number (nBits) of one-bit flags. Each flag is either true (1) or false (0). For example, consider a BitSet that represents the channels of an instrument that have been measured. The nBits member is the number of channels in the instrument. The elements in pbits are all zero except for those which have been measured. More specifically, if the instrument has 17 channels and channels 1, 5, and 10 have been measured, then:

nBits=17;

pBits[0]=0x00000422; //binary: 0000 000 000 0100 0010 0010

```
struct
{
    BitSet channels;           // channels considered for the composite
    BitSet channelsWithData;   // channels with data included in
                               //   the composite
    ChannelScan composite;     // result of combining data
    u32 nChannelsWithData;     // number of channels with data
    BitSet *pContributors;     // allocated array, one per point
} CompositeScan;               //   in composite
```

The first two members, channels and channelsWithData, describe the origin of the data for the composite.

The former gives the set of channels which were given for building the composite. The latter gives the set of channels that actually had data that needed to be combined into the composite. The nChannelsWithData member is simply for convenience. It equals the number of bits true in channelsWithData. This is the maximum number of channels that may contribute activity at any given point in the composite scan.

The composite holds the result of merging the data from the channels in channelsWithData. The merge must take into account the (possibly) different values for tRes, vRes, tMin, and vMin in each of the source measurements. If these are the same for all, then the same values are used in the composite. If not, the smallest values of each are used. Then, the composite's kRows and jCols are calculated such that the composite covers the largest time and voltage scan positions recorded in the source measurements.

Since the composite has a resolution in both time and volts at least as high as that of any source measurement, there is either none or one element in each source measurement that corresponds to each element in the composite.

The actual set of contributing channels at each point is held in the array pContributors, which is a 2-D array of type BitSet. The array itself has the same number of rows and columns as the numCounts and numClocks arrays inside composite. Thus, there is a one-to-one correspondence between elements of pContributors, ChannelScan::numCounts, and ChannelScan::numClocks.

To save space, each BitSet in pContributors has only nChannelsWithData bits defined. Using the example given above with the discussion of the BitSet structure itself, there would be three bits defined in each BitSet. Bit 0 corresponds to the lowest bit in the original set (bit 1 in this case), bit 1 to bit 5, and bit 2 to bit 10:

TABLE III

Example relationship between channels numbers and contributors

| Instrument channel number (bit number in channels and channelsWithData) | Instrument Channel Has Data (bit value in channels and channelsWithData) | Contributor bit number (bit number in pContributors) |
|---|---|---|
| 16 | 0 | — |
| 15 | 0 | — |
| 14 | 0 | — |
| 13 | 0 | — |
| 12 | 0 | — |
| 11 | 0 | — |
| 10 | 1 | 2 |
| 9 | 0 | — |
| 8 | 0 | — |
| 7 | 0 | — |
| 6 | 0 | — |
| 5 | 1 | 1 |
| 4 | 0 | — |
| 3 | 0 | — |
| 2 | 0 | — |
| 1 | 1 | 0 |
| 0 | 0 | — |

In other words, in each pContributors element, the i'th bit is set if the i'th channel indicated in channelsWithData (starting from position 0) had a nonzero count at the corresponding position in its own pNumCounts array.

Example Display Modes Supported by CompositeScan
Mode 1: Normalized Signal Density Each scan position in the composite member has the sum of the transitions seen across all channels at that point and the sum of the clock cycles measured across all channels at that point. This is the information needed for a transition density (numTransitions/numClocks).

Mode 2: Channel Density

Channel density in a composite measurement is defined at each scan position as the ratio of the number of channels observed to have activity at that point to the number of channels under consideration. If no channels had activity, the density is zero. If all did, the density is 1.0. If 3 out of 8 did, the density is 0.375. To obtain this from Composite Scan, find the number of bits true in pContributors at each desired scan position and divide by nChannelsWithData.

Building CompositeScan

CompositeScan is built from information in one or more existing ChannelScan structures. The goal is to create a new Channel Scan with the sum of the information in the source structures. There are these four steps:

1. Determine values for channels, channels with Data, and nChannelsWithData;
2. Determine values for channel, tRes, vRes, tMin, vMin, jCols, and kRows;
3. Determine values for numCounts and numClocks for each element in the new pNumCounts and pNumClocks arrays; and
4. Determine the value of each pContributor element (one for each element in pNumCounts and pNumClocks).

Step 1: Considering the entire collection of ChannelScan structures to be built into the CompositeScan:
  a) Resize the channels and channelsWithData to the largest channel number in the collection.
  b) Clear all bits in channels and channelsWithData.
  c) For each member of the collection, set the bit in channels for that channel number.
  d) For each member of the collection, set the bit in channelsWithData for that channel number if one or more scan points were measured.
  e) nChannelsWithData=number of bits true in channelsWithData.

If nChannelsWithData is zero, then no measured points exist in this collection. Create an empty composite and quit.

Step 2: Considering only the collection of ChannelScan structures to be built into the CompositeScan that have one or more measured points:

channel=lowest channel in the collection (arbitrary choice)
tRes=minimum value of tRes in the collection
vRes=minimum value of vRes in the collection
tMin=minimum value of tMin in the collection
vMin=minimum value of vMin in the collection
jCols=cell(((<maximum time of any scan position in the collection>−tmin)/tRes)+1)
kRows=cell(((<maximum voltage of any scan position in the collection>−vMin)/vRes)+1)

Where cell(x) is the ceiling function, which returns the smallest integer greater than or equal to x.

Step 3: Build pNumCounts and pNumClocks arrays

```
for (k = 0; k < kRows; k++)
begin
    for (j = 0; j < jCols; j++)
    begin
        nCounts = 0;
        nClocks = 0;
        for (ch = <lowest channel with data>;
             ch <= <highest channel with data>;
             ch = <next channel with data>)
        begin
            x = <column in this channel's data equivalent to j>
            y = <row in this channel's data equivalent to k>
            if <x is a legal column> and <y is a legal row>
            then
                ncounts += <this channel's data>.ncounts[y,x]
                nclocks += <this channel's data>.nclocks[y,x]
            end
            <composite>.ncounts[k,j] = ncounts;
            <composite>.nclocks[k,j] = nclocks;
        end
    end
end
```

Step 4: Determine contents of each pContributor element

```
for (k = 0; k < kRows; k++)
begin
    for (j = 0; j < jCols; j++)
    begin
```

-continued

```
    bitNumber = 0
    for (ch = <lowest channel with data>;
         ch <= <highest channel with data>;
         ch = <next channel with data>)
    begin
        x = <column in this channel's data equivalent to j>
        y = <row in this channel's data equivalent to k>
        if <x is a legal column> and <y is a legal row>
        then
          if <this channel's data>.ncounts[y,x] > 0
          then
            pContributors[k,j].bit(bitNumber) = true
          end
        end
        bitNumber = bitNumber + 1
      end
    end
end
```

We claim:

1. A method of creating a composite eye diagram for a collection of measured data signals from a System Under Test, the method comprising the steps of:

(a) assigning separate data signals of interest to be members of a collection;

(b) sampling at times relative to a reference signal the voltage of each separate data signal assigned to the collection;

(c) for each separate data signal of step (b), populating respectively associated first eye diagram data structures with TIME, VOLTAGE, and NUMBER OF HITS information useable to create a corresponding component eye diagram for each such Separate data signal of step (b);

(d) traversing the first eye diagram data structures of step (c) and combining their data content according to a selected rule to populate a resulting second eye diagram data structure of the same structure as the first eye diagram data structures, the combined data in the resulting second eye diagram data structure representing a composite eye diagram whose component eye diagrams correspond to the collection of step (a);

(e) selecting as a populated eye diagram data structure from among those of steps (c) and (d) the resulting second eye diagram data structure; and (f) displaying the composite eye diagram represented by the resulting second eye diagram data structure of step (d) selected in step (e).

2. A method as in claim 1 wherein there are N-many data signals in the collection and the selected rule of step (d) comprises finding a normalized density $D_i$ for each of i-many $(X, Y)_i$ TIME and VOLTAGE combinations:

$$D_i = \Sigma \text{\# of hits for data signal } J@(X, Y)_i / \Sigma \text{\# of clocks for data signal } J@(X, Y)_i$$

where each $\Sigma$ is from J=1 to J=N.

3. A method as in claim 2 wherein the displaying step (f) comprises the step of varying the intensity of the composite eye diagram according to values of $D_i$.

4. A method as in claim 2 wherein the displaying step (f) comprises the step of varying the color of the composite eye diagram according to values of $D_i$.

5. A method as in claim 1 wherein there are N-many data signals in the collection and the selected rule of step (d) comprises finding an average density $D_i$ for each of i-many $(X, Y)_i$ TIME and VOLTAGE combinations:

$$D_i = (1/N)\Sigma[\text{\# of hits for data signal } J@(X, Y)_i / \text{\# of clocks for data signal } J@(X, Y)_i],$$

where the $\Sigma$ is from J=1 to J=N.

6. A method as in claim 5 wherein the displaying step (f) comprises the step of varying the intensity of the composite eye diagram according to values of $D_i$.

7. A method as in claim 5 wherein the displaying step (f) comprises the step of varying the color of the composite eye diagram according to values of $D_i$.

8. A method as in claim 1 wherein there are N-many data signals in the collection and the selected rule of step (d) comprises finding a channel density $D_i$ for each of i-many $(X, Y)_i$ TIME and VOLTAGE combinations:

$$D_i = \Sigma \Delta(i, J)/N$$

where the $\Sigma$ is from J=1 to J=N and $\Delta(i, J) = [1|0]$ is a selected substitution for an associated NUMBER OF HITS divided by an associated NUMBER OF CLOCK CYCLES at each $(X, Y)_i$.

9. A method as in claim 8 wherein the displaying step (f) comprises the step of varying the intensity of the composite eye diagram according to values of $D_i$.

10. A method as in claim 8 wherein the displaying step (f) comprises the step of varying the color of the composite eye diagram according to values of $D_i$.

11. A method as in claim 1 wherein the displaying step (f) comprises the step of varying the intensity of the composite eye diagram according to results produced by the selected rule of step (d).

12. A method as in claim 1 wherein the displaying step (f) comprises the step of varying the color of the composite eye diagram according to results produced by the selected rule of step (d).

* * * * *